United States Patent [19]

Quinn

[11] Patent Number: 5,272,113

[45] Date of Patent: Dec. 21, 1993

[54] METHOD FOR MINIMIZING STRESS BETWEEN SEMICONDUCTOR CHIPS HAVING A COEFFICIENT OF THERMAL EXPANSION DIFFERENT FROM THAT OF A MOUNTING SUBSTRATE

[75] Inventor: Kraig A. Quinn, Webster, N.Y.

[73] Assignee: Xerox Corporation, Stamford, Conn.

[21] Appl. No.: 974,567

[22] Filed: Nov. 12, 1992

[51] Int. Cl.$^5$ .................. H01L 21/58; H01L 21/84
[52] U.S. Cl. ................... 437/205; 437/248; 156/80
[58] Field of Search ............... 437/205, 248; 156/80, 156/282, 311

[56] References Cited

U.S. PATENT DOCUMENTS

| | | | |
|---|---|---|---|
| 4,814,296 | 3/1989 | Jedlicka et al. | 437/226 |
| 4,903,118 | 2/1990 | Iwade | 357/72 |
| 4,956,695 | 9/1990 | Robinson et al. | 357/74 |
| 4,970,575 | 11/1990 | Soga et al. | 357/72 |
| 5,045,922 | 9/1991 | Kodama et al. | 357/75 |
| 5,134,462 | 7/1992 | Freyman et al. | 357/74 |
| 5,153,421 | 10/1992 | Tandon et al. | 250/208.1 |

OTHER PUBLICATIONS

"Laminating Technique for Copper Inner Planes of Multilayer Printed Circuit Board"; IBM Technical Disclosure Bulletin, vol. 25, No. 11B Apr. 1983 T. J. Carey, Jr. et al.

Primary Examiner—Robert Kunemund
Assistant Examiner—David E. Graybill
Attorney, Agent, or Firm—R. Hutter

[57] ABSTRACT

Semiconductor chips, such as photosensor arrays in a full-width scanner, are mounted on a substrate to maintain reasonably consistent spacing among chips regardless of temperature conditions during use. After chips are tacked onto the substrate with uncured epoxy, the assembly is brought to a low temperature prior to the heating of the curing step. The technique permits design of the assembly to compensate for differences between the thermal coefficient of expansion of the chips and that of the substrate, while also minimizing mechanical stresses on the chips caused by heating in the course of use.

5 Claims, 1 Drawing Sheet

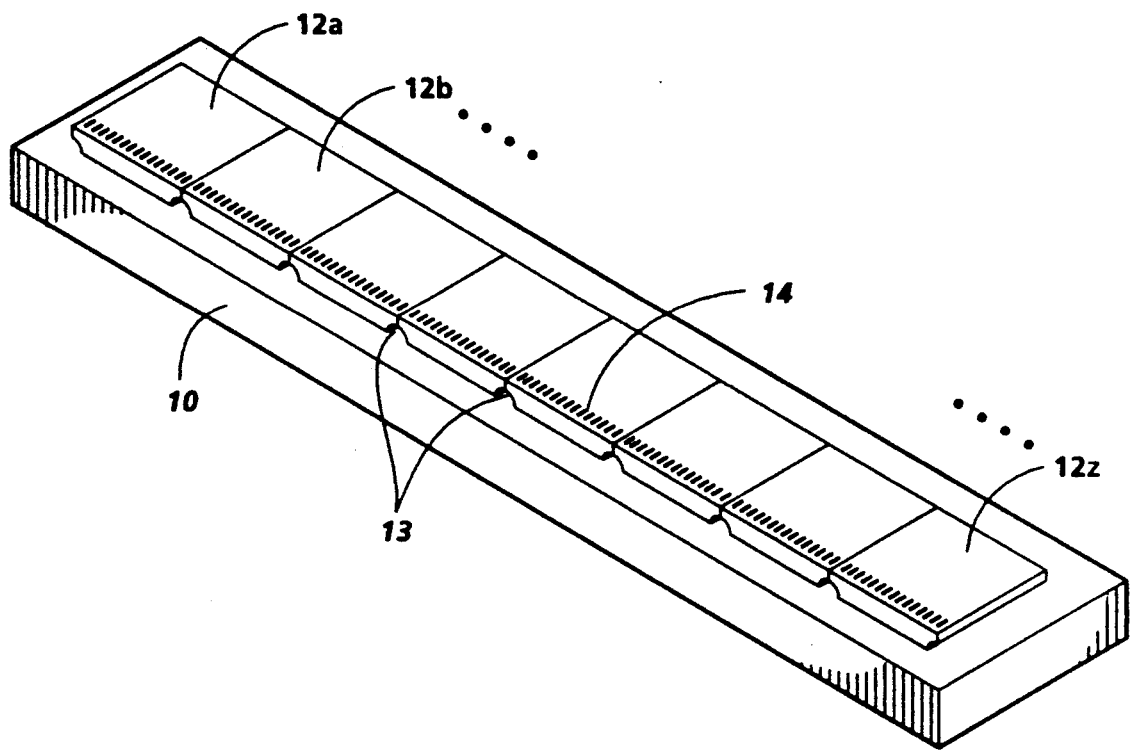

METHOD FOR MINIMIZING STRESS BETWEEN SEMICONDUCTOR CHIPS HAVING A COEFFICIENT OF THERMAL EXPANSION DIFFERENT FROM THAT OF A MOUNTING SUBSTRATE

The present invention relates generally to semiconductor chips which are mounted on a substrate. In particular, the present invention relates to a method whereby semiconductor chips may be mounted on a substrate which has a thermal coefficient of expansion significantly different from that of the semiconductor chips.

Image sensors for scanning document images, such as charge coupled devices (CCDs), typically have a row or linear array of photosites together with suitable supporting circuitry integrated onto a silicon chip. Usually, a sensor is used to scan line by line across the width of a document with the document being moved or stepped lengthwise in synchronism therewith. A typical architecture for such a sensor array is given, for example, in U.S. Pat. No. 5,153,421.

In a scanning system, the image resolution is proportional to the ratio of the scan width and the number of array photosites. Because of the difficulty in economically designing and fabricating an array of photosites comparable in length to the width of an image, optical reduction of the scan line to a length considerably shorter than the actual width of the image is fairly common in scanners and facsimile machines currently available. Because of the optical reduction, image resolution typically available today is relatively low when used to scan a full line. A long or full-width array having a length equal to or larger than the document line and with a large packing of co-linear photosites to assure high resolution has been and remains a very desirable but difficult aim. In the pursuit of a long or full-width array, forming the array by assembling several small chips together end to end has often been postulated. However, the need, which is critical, to provide chips with photosites extending to the border or edge of the chip, so as to assure continuity when the set of chips are assembled into a full-width array, and at the same time provide edges that are sufficiently smooth and straight to be assembled together without loss of image data, has proven to be a formidable obstacle. Although the standard technique of scribing and cleaving silicon wafers used by the semiconductor industry for many years produces chips having reasonably controlled dimensions, the microscopic damage occurring to the chip surface during the scribing operation effectively precludes the disposition of photosites at the chip edge. Varios techniques have been proposed in the prior art for cleaving wafers into chips in a manner that preserves the accuracy of dimensions and avoids damage to the chips. One example of such a technique, incorporating the chemical etching of V-shaped grooves prior to the sawing step, is shown in U.S. Pat. No. 4,814,296.

Another problem incident to the abutting of a plurality of chips into a single full-width array involves spacing the chips relative to each other so that the long array of photosites formed by the plurality of chips is of a substantially even spacing with a minimum of anomalies, particularly between the last photosite of one chip and the first photosite of the next. Improper spacing between two chips will cause the spacing between these two end photosites to be either too close or too far relative to the regular spacing of photosite within each chip. Further complicating this spacing problem is the question of the thermal coefficient of expansion, or TCE, of the chips themselves, and in particular of the chips relative to the member on which the chips are mounted within the apparatus. Such a thermal mismatch could cause undesirable bowing of the assembly during temperature cycling, much in the manner of the familiar bimetallic strip. Such mechanical stressing of the relatively brittle chips is likely to damage the chips.

One possible technique for avoiding the problem of thermal expansion of the substrate is to choose a material for the substrate which has a TCE very close to that of the chip material (usually silicon, or gallium arsenide). However, this consideration adds another inconvenient design constraint to the construction of a system.

When substrates which have a TCE very close to that of silicon are used, the likely materials that are available to a system designer may be either expensive or have the significant drawback that these material, do not lend themselves to standard processing techniques in order to place circuitry for the chips directly onto the substrate. Since virtually all standard substrate materials have a TCE higher than that of semiconductor chips, it would be extremely useful and convenient to a designer of such a system if these materials could be used. One substrate material which has proven very useful for other reasons for mounting of chips thereon is known as alumina, which primarily comprises aluminum oxide. Heretofore, when such a substrate has been used in a long array, the problems of thermal expansion have typically been circumvented either by providing relatively large gaps of 25μ or more between chips (with conspicuous results in image quality, in the context of photosensitive arrays) or by providing two staggered rows of chips (which considerably adds to the cost of the assembly and requires additional processing of the image information). A technique of fabricating a high-quality full-width array from a plurality of butted silicon chips, whether the chips are photosensitive CCD's, thermal ink-jet chips, or any other type of semi-conductor device onto such a substrate, would free up a significant constraint for designers and manufacturers of such devices.

U.S. Pat. No. 4,903,118 discloses a semiconductor chip attached to a substrate by two kinds of bonding agents, one of which is rigid and disposed at the central region of the chip, the other of which is disposed around the perimeter of the rigid bonding agent and which is sufficiently resilient to accommodate the thermal expansion differences between the semiconductor chip and the substrate.

U.S. Pat. No. 4,956,695 discloses a three-dimensional focal plane array constructed from a plurality of silicon dies. Each die has gold ribbon leads bonded to its silicon face, with the leads extending beyond the edge of the die. A ceramic spacer having a thickness substantially equal to the thickness of the die is placed adjacent an edge of the die with the gold leads also bonded to the ceramic spacer. The ceramic spacers have a relatively low coefficient of thermal expansion, preferably substantially the same as the coefficient for silicon. The spacers and protruding leads are lapped and polished to form a planar bonding surface.

U.S. Pat. No. 4,970,575 discloses a semiconductor device in which semiconductor chips are connected to a substrate by solder bumps, with a vacant space around the solder bumps coated with resin, except that the tops of the chips are not coated. Epoxy resin, or a resin having a smaller expansion coefficient than the epoxy resin, is used in the resin coating, and an inorganic material having a smaller expansion coefficient than the resin is mixed therein.

U.S. Pat. No. 5,045,922 discloses a structure in which a plurality of integrated circuit devices of different base materials are installed on the same substrate. The wiring density of the chip having the larger thermal conductivity is higher than that of the chip having a smaller thermal conductivity.

U.S. Pat. No. 5,134,462 discloses a flexible film chip carrier, in which a semiconductor device affixed to a flexible film substrate having metallization patterns. A cover is attached to the substrate over the device, and the assembly is heated to expand the substrate. Upon cooling, the substrate shrinks and becomes taut and planar within the area of the cover.

According to the present invention, there is provided an assembly in which a plurality of semiconductor chips having a first thermal coefficient of expansion are mounted on a substrate having a second thermal coefficient of expansion. The semiconductor chips are applied to a surface of the substrate with a thixotropic epoxy in a substantially liquid state, whereby each semiconductor chip contacts another semiconductor chip. The substrate is cooled to a predetermined temperature lower thaN any expected temperature that the final assembly is likely to encounter. Then, the substrate is heated to cure the epoxy.

BRIEF DESCRIPTION OF THE DRAWING

The FIGURE is a simplified perspective view showing a base substrate having a plurality of butted silicon chips mounted thereon, to illustrate the method of the present invention.

In the FIGURE is shown a base substrate 10 having a plurality of butted silicon chips 12a, 12b, . . . 12z mounted thereon. Although the chips 12a-12z shown in the Figure are not specified as to function, it will be understood that they each may represent a portion of a CCD, another type of photosensitive semiconductor chip, an LED (light-emitting diode) print bar, a chip relating to thermal ink-jet technology, or any other purpose in which a series of semiconductor chips are required to be arranged in butted fashion. At the side interfaces between adjacent chips 12 on the substrate 10, are preferably formed back-cuts 13. Back-cuts 13 are open-ended grooves having the open ends thereof disposed adjacent the surface of substrate 12, and serve to provide narrow cavities between the adjacent chips and the substrate 10. Such back-cuts are shown, for example, in U.S. Pat. No. 4,814,296. In one typical application of butted chips on a substrate, the chips 12a-12z are of a thickness of approximately 17 mils, with back-cuts at the edges thereof so that the thickness of each chip in the area of a back-cut is about 6 mils. The cavities formed by back-cuts 13 are useful, among other reasons, for receiving excess quantities of epoxy placed on the substrate 10 and pressed out from under the chips in the array assembly process, as will be explained below.

Also defined on each chip 12a, 12b, . . . 12z is a set of repetitive structures 14. As used in the specification and claims herein, "repetitive structure" relates to any regularly-spaced devices or structures on each chip which form a regular pattern. These structures may be, by way of example and not limitation, photosites in a CCD, LED's, or capillary channels or resistors in portions of thermal ink-jet printheads. As mentioned above, the regular spacing of such repetitive structures is usually crucial to maintain on a chip-to-chip basis, particularly in the gaps between adjacent chips.

For most semiconductor applications, the most common primary material for chips 12a-12z is crystalline silicon. This substance has a relatively low TCE; that is, only relatively small dimensional changes occur to crystalline silicon along a range of usable temperatures to which it is likely to be subjected. In contrast, one desirable material for substrate 10, from a cost and ease of construction standpoint, is a metal oxide or ceramic material such as alumina. If such a completed array is subjected to temperatures lower than the temperature at which it was initially assembled (typically room temperature) than the action of the substrate contracting more than the chip array will cause compressive stresses on the relatively fragile chips. Such conditions typically occur during storage and shipping.

The method of the present invention allows the use of substrate materials with relatively high TCE's in butted chip arrays which overcomes the shortfalls mentioned.

According to the method of the present invention, which is useful in the common case wherein the desired substrate to be used, such as alumina, is known to have a higher TCE than the material of the chips 12a-12z, which are commonly silicon or gallium arsenide, the following steps are carried out: First, the chips are tacked onto the substrate with a thixotropic epoxy in a gel or liquefied form. For the initial tacking, the chips are butted so that their side surfaces are in direct contact. Then, the assembled array is cooled significantly, preferably to a temperature lower than any storage temperature the completed array is likely to experience. When the epoxy is in its liquid, uncured state, the epoxy will hold the chips onto place but will allow the chips to move relative to the surface of the substrate 10. During this "cooling" step, the relatively pronounced contraction of the substrate 10 beneath the butted chips will cause some sliding of the top surface of the substrate relative to the bottom surface of the chips, because the substrate is contracting to a much greater extent than the chips. After this low temperature process cycle, the array is placed into an oven, typically at 125° to 150° C., in which the substrate will expand more than the chip array, curing the epoxy and leaving very small gaps between adjacent chips. The key is that the initial cooling step in effect draws the chips together on the substrate as closely as foreseeably possible; both the chips and substrate are at a point of maximum compression. From this low-temperature state of maximum contraction, any expansion caused by subsequent heating or use will originate from a basic state of maximum contraction, and therefore there will be a minimum of shear forces between the surface of the chips and the surface of the substrate as the substrate expands.

The technique of the present invention allows substrate materials, other than those which have a very close TCE match to the semiconductor chip material, to be considered for use in full-width arrays. The method also automatically compensates for TCE variations from one individual substrate 10 to the next, or even TCE variations within a single substrate. Through appropriate temperature processing, minute gaps are deliberately induced between chips to compensate for temperature gradients between the chip array and the substrate. That is, because of this low-temperature step, the spacing anomaly between the end photosites of abutting chips can be predicted and thus compensated for in the design of the chips. The method of the present invention inherently gives the minimum amount of chip to chip spacing to compensate for TCE mismatch between the chip material and the substrate. The method of the present invention can be used even if it is unknown whether the TCE of the substrate is higher or lower than that of the chips.

Another enhancement of the method of the present invention would be, during the low temperature processing step, to deliberately cool the substrate more than the chip array, creating a temperature gradient between the chip array and the substrate. This method could be used, for example, where the substrate is very closely TCE matched to the chip array, and would be useful because the chip array is always the heat source during operation so they are at a higher temperature than the substrate and therefore expand more than the substrate. There would then be small gaps created between the chips in which to allow additional expansion of the chips so as not to mechanically stress the chips or cause the assembly to warp during operation.

In addition to the assembly comprising a single row of chips on a substrate, the present invention may also be embodied in a two-dimensional array of chips on a substrate, wherein the chips are abutted against one another in rows and columns.

What follows are calculations relating to a practical example of the application of the method of the present invention.

Assumptions: The substrate is alumina (TCE of 6.55 ppm/°C.). The chips are silicon, with a TCE of 3.0 ppm/°C. The array is assembled by abutting the chips together at room temperature, in accordance with the method of the present invention. No temperature gradient is induced between the chip array and substrate during low temperature processing (the "freezing" step). No temperature gradient is induced between the chip array and the substrate during operation of the chips as part of a scanning apparatus. Low temperature processing done at $-20°$ C. Array operating temperature is 60° C. Total array length is 315 mm, consisting of twenty (20) 15.748 mm long chips, butted at room temperature (25° C.). The chips each define a set of photosites spaced at 400 spots per inch, thus having a center-to-center spacing of 63.5 $\mu$m. The amount by which the substrate shrinks more than the chip array by going from the 25° C. array assembly temperature to $-20°$ C. low temperature processing temperature is therefore:

$$0.315 \text{ m} \times [(6.55-3.0) \times 10^{-6} \text{ m/m/°C.}][25-(-20)°\text{C.}] = 50.3 \ \mu\text{m}$$

Chip to chip gap when the array is brought back up to 25° C. room temperature = 50.3 ÷ 19 gaps = 2.6 $\mu$m gap between chips; very manageable in view of standard 63.5 $\mu$m spacing of photosites Chip to chip gap at 150° C. epoxy curing temperature: 10.0 $\mu$m Chip to chip gap at 60° C. operating temperature: 4.7 $\mu$m Further assumptions: the chip array is a large source of heat and the chip array operates at a temperature of 85° C. and the substrate at a temperature of 55° C., assuming no thermal gradient across the chip thickness and that there is no thermal gradient across the substrate thickness. Given this set of conditions even in a butted chip array which is perfectly TCE matched to the substrate, the chips will experience compressive stress (inducing bowing of the array and possible chip damage) because the chips are at a temperature higher than the substrate. However, for the array assembled in this example:

Chip to chip gap with chip array at 85° C. and the substrate at 55° C. = [{0.315 m × 6.55 × $10^{-6}$ m/m/°C. [55 − (−20)°C.]} − {0.315 m × 3.0 × $10^{-6}$ m/m/°C.[85 − (−20)]°C.}] ÷ 19 gaps = 2.9 $\mu$m; still very manageable in view of standard 63.5 $\mu$m spacing of photosites.

It is clear from the above example, then, that the technique of the present invention facilitates the design of versatile, failure-resistant, and relatively inexpensive large arrays of semiconductor devices, using a variety of materials heretofore unavailable to designers of such arrays.

While the present invention has been described in connection with a preferred embodiment thereof, it will be understood that it is not intended to limit the invention to that embodiment. On the contrary, it is intended to cover all alternatives, modifications, and equivalents as may be included within the spirit and scope of the invention as defined by the appended claims.

I claim:

1. A method for mounting a plurality of semiconductor chips having a first thermal coefficient of expansion on a substrate having a second thermal coefficient of expansion, comprising the steps of:
   applying the semiconductor chips to a surface of the substrate with a thixotropic epoxy in a substantially liquid state, with each semiconductor chip being in contact with an adjacent semiconductor chip;
   cooling the substrate to a temperature lower than a preselected temperature corresponding to normal operating temperatures of the semiconductor chips; and
   heating the substrate and chips to cure the epoxy.

2. A method as in claim 1, further comprising the step of selecting the semiconductor chips and substrate so that the first thermal coefficient of expansion is less than the second thermal coefficient of expansion.

3. A method as in claim 1, further comprising the step of cooling the semiconductor chips to a second predetermined temperature higher than the first-mentioned temperature of the substrate.

4. A method as in claim 1, further comprising the step of providing on the semiconductor chips open-ended grooves having the open end disposed adjacent the substrate.

5. A method as in claim 1, wherein the cooling step cools the substrate to a temperature less than 0° C.

* * * * *